United States Patent
Freund (10) Patent No.: US 8,687,664 B2
(45) Date of Patent: Apr. 1, 2014

(54) LASER ASSEMBLY WITH INTEGRATED PHOTODIODE

(75) Inventor: Joseph Michael Freund, Fogelsville, PA (US)

(73) Assignee: Agere Systems LLC, Allentown, PA (US)

( * ) Notice: Subject to any disclaimer, the term of this patent is extended or adjusted under 35 U.S.C. 154(b) by 0 days.

(21) Appl. No.: 11/371,277

(22) Filed: Mar. 8, 2006

(65) Prior Publication Data

US 2007/0211778 A1    Sep. 13, 2007

(51) Int. Cl.
*H01S 5/183*    (2006.01)
*H01S 5/0683*    (2006.01)

(52) U.S. Cl.
USPC .................................. 372/50.21; 372/50.124

(58) Field of Classification Search
USPC .......................................... 372/50.124, 50.21
See application file for complete search history.

(56) References Cited

U.S. PATENT DOCUMENTS

| | | | |
|---|---|---|---|
| 3,150,999 A * | 9/1964 | Hermann et al. | 136/256 |
| 4,348,254 A * | 9/1982 | Lindmayer | 438/71 |
| 5,032,879 A | 7/1991 | Buchmann et al. | |
| 5,258,991 A | 11/1993 | Peterson | |
| 5,574,744 A * | 11/1996 | Gaw et al. | 372/50.21 |
| 5,696,862 A | 12/1997 | Hauer et al. | |
| 6,005,262 A | 12/1999 | Cunningham et al. | |
| 6,597,713 B2 * | 7/2003 | Ouchi | 372/36 |
| 6,633,598 B1 * | 10/2003 | Kimizuka et al. | 372/50.21 |
| 6,879,611 B1 | 4/2005 | Johansson et al. | |
| 6,922,423 B2 | 7/2005 | Thornton | |
| 2002/0037137 A1 | 3/2002 | Wu et al. | |
| 2003/0002552 A1 * | 1/2003 | Nagara | 372/38.02 |
| 2003/0021327 A1 | 1/2003 | Murry | |
| 2003/0026303 A1 | 2/2003 | Ouchi | |
| 2003/0123508 A1 * | 7/2003 | Werner et al. | 372/50 |
| 2004/0264537 A1 * | 12/2004 | Jackson | 372/50 |
| 2005/0147360 A1 * | 7/2005 | Kwak et al. | 385/93 |
| 2005/0189473 A1 | 9/2005 | Schrodinger | |
| 2006/0146904 A1 * | 7/2006 | Guenter et al. | 372/50.124 |

(Continued)

FOREIGN PATENT DOCUMENTS

| | | |
|---|---|---|
| CN | 102136676 A | 7/2011 |
| EP | 0410067 | 1/1991 |

(Continued)

OTHER PUBLICATIONS

Sze, S. M., "Physics of Semiconductor Devices", 1981, Wiley-Interscience, 2nd Ed., 117.*

(Continued)

*Primary Examiner* — Jessica Stultz
*Assistant Examiner* — Joshua King
(74) *Attorney, Agent, or Firm* — Ryan, Mason & Lewis, LLP (57) ABSTRACT

A laser assembly comprises a substrate, one or more standoffs and a semiconductor laser. The substrate has a first doped region and a second doped region. The second doped region is proximate to an upper surface of the substrate and forms a pn junction with the first doped region. The semiconductor laser is operative to emit light from an upper surface and a lower surface. Moreover, the semiconductor laser is attached to the upper surface of the substrate with the one or more standoffs such that the light emitted from the lower surface of the semiconductor laser impinges on the second doped region.

20 Claims, 6 Drawing Sheets

(56) References Cited

U.S. PATENT DOCUMENTS

| | | | |
|---|---|---|---|
| 2007/0025405 A1* | 2/2007 | Pan et al. | 372/50.21 |
| 2008/0240194 A1 | 10/2008 | Maeda et al. | |
| 2011/0182315 A1 | 7/2011 | Shiozaki et al. | |
| 2012/0183009 A1 | 7/2012 | Adachi et al. | |
| 2012/0281727 A1 | 11/2012 | Fang et al. | |

FOREIGN PATENT DOCUMENTS

| | | | |
|---|---|---|---|
| EP | 975072 A2 | 1/2000 | |
| GB | 2490596 A | 11/2012 | |
| JP | 62195191 A | 8/1987 | |
| JP | 200040840 | 2/2000 | |
| JP | 2000193852 A | 7/2000 | |
| JP | 2000349392 A | 12/2000 | |
| WO | WO03000019 A2 * | 1/2003 | |

OTHER PUBLICATIONS

Ng, Kwok K., "Complete Guide to Semiconductor Devices", 2002, Wiley-Interscience, 2nd Ed., 431-437.*

G. Bernhardt et al., "Performance of Zr and Ti Adhesion Layers for Bonding of Platinum Metallization to Sapphire Substrates," Sensors and Actuators B: Chemical, Jun. 2001, pp. 368-374, vol. 77, No. 1.

S.-H. Huang et al., "Improved Light Extraction of Nitride-Based Flip-Chip Light-Emitting Diodes Via Sapphire Shaping and Texturing," IEEE Photonics Technology Letters, Dec. 2006, 14 pages, vol. 18, No. 24.

H. Gao et al., "Improvement of GaN-Based Light Emitting Diodes Performance Grown on Sapphire Substrates Patterned by Wet Etching," Solid State Lighting and Solar Energy Technologies, Proceedings of the SPIE, 2008, 6 pages, vol. 6841.

H. Qiang et al., "Characterization of Thick GaN Films Directly Grown on Wet-Etching Patterned Sapphire by HVPE," Chinese Physics Letters, Sep. 2009, pp. 96801-1-96801-4, vol. 26, No. 9.

H.-S. Cheong et al., "Growth and Characteristics of Near-UV LED Structures on Wet-Etched Patterned Sapphire Substrate," Journal of Semiconductor Technology and Science, Sep. 2006, pp. 199-205, vol. 6, No. 3.

J. Wang et al., "Fabrication of Patterned Sapphire Substrate by Wet Chemical Etching for Maskless Lateral Overgrowth of GaN," Journal of the Electrochemical Society, 2006, pp. 182-185, vol. 153, No. 3.

I.L. Krestnikov et al., "Photopumped InGaN/GaN/AlGaN Vertical Cavity Surface Emitting Laser Operating at Room Temperature," Physical Status Solidi, 1999, pp. 511-515, vol. 216.

* cited by examiner

LASER ASSEMBLY WITH INTEGRATED PHOTODIODE

FIELD OF THE INVENTION

This invention relates generally to semiconductor lasers, and, more particularly, to assemblies comprising surface-emitting lasers.

BACKGROUND OF THE INVENTION

Semiconductor lasers are typically fabricated on semiconductor wafers before they are cleaved into discrete laser devices. Semiconductor lasers may be edge-emitting lasers (EELs) or surface-emitting lasers (SELs). In EELs, the direction of light output is parallel to the wafer surface, while, in SELs, the direction of light output is perpendicular to the wafer surface. A SEL usually comprises an active region with one or more quantum wells for light generation. This active region, in turn, is sandwiched between upper and lower distributed Bragg reflector (DBR) mirrors. The DBR mirrors are constructed from a combination of semiconductor and dielectric layers with differing refractive indices. The upper DBR mirror typically has a lower reflectivity than the lower DBR mirror and is, therefore, the exit mirror through which the primary light output of the SEL is emitted.

SELs have various advantages over EELs for some applications including telecommunications and optical storage. A SEL, for example, typically has light output that is more circular and has a smaller divergence angle than the light output generated by an EEL. SELs may also be less costly to produce and more energy efficient. Finally, SELS are easier to test during manufacturing than EELs. This is due to the fact that EELs, unlike SELS, cannot be tested when they are still incorporated in a semiconductor wafer because of the parallel direction of light output.

The output power of a semiconductor laser is critically dependent on the operating temperature of that laser. As a result, automatic power control feedback methods are frequently implemented when using a semiconductor laser in order to maintain the laser's output power at a constant target value as the laser changes temperature. Automatic power control of a semiconductor laser is usually achieved by monitoring the output power of the laser using a monitor photodiode. The monitor photodiode generates an electrical output signal that is communicated to control circuitry external to the laser assembly. The control circuitry then determines the appropriate drive power that should be supplied to the laser in order to maintain the laser's output power at the constant target value.

However, automatic power control of SELs may be problematic. Conventionally, in order to implement automatic power control in a SEL, several optical devices, such as mirrors, beam splitters, lenses and the like are positioned in the optical path of the primary light output. These optical devices act to steer a portion of the primary light output to a nearby monitor photodiode which, in turn, sends an electrical output signal to the control circuitry. Nevertheless, these optical devices are frequently difficult to position in a reproducible manner from laser assembly to laser assembly. As a result, monitor photodiodes in laser assemblies of the same type will frequently see differing amounts of light for a given laser output power. Moreover, the optical devices used for monitoring the primary light output of SELs are relatively expensive, attenuate the output of the SEL being monitored, and frequently produce unsatisfactory power control.

There is, as a result, a need for an easily fabricated, inexpensive SEL assembly that allows automatic power control without using the primary light output of the SEL to monitor output power.

SUMMARY OF THE INVENTION

Embodiments of the present invention address the above-identified need by providing assemblies for use in applications involving SELs. These assemblies utilize a substrate with an integrated photodiode for automatic power control. The photodiode monitors the secondary light output that is transmitted through the lower DBR mirror of the SEL. In this way, the primary light output of the SEL is not involved in the automatic power control.

In accordance with an aspect of the invention, a laser assembly comprises a substrate, one or more standoffs and a semiconductor laser. The substrate has a first doped region and a second doped region. The second doped region is proximate to an upper surface of the substrate and forms a pn junction with the first doped region. The semiconductor laser is operative to emit light from an upper surface and a lower surface. Moreover, the semiconductor laser is attached to the upper surface of the substrate with the one or more standoffs such that the light emitted from the lower surface of the semiconductor laser impinges on the second doped region.

In an illustrative embodiment of the invention, an assembly comprises an n-doped silicon substrate with a p-doped region proximate to an upper surface of the substrate. These n-doped and p-doped regions form a photosensitive pn junction. A SEL is mounted to the upper surface of the substrate with three metallic standoffs and is powered by external control circuitry. The SEL emits its primary light output from its upper surface but also emits secondary light from its lower surface. The light emitted from the lower surface of the SEL impinges on the diffusion region and causes current to flow in the pn junction. This current is fed back to the control circuitry which utilizes the current to maintain the SEL at a target output power.

Advantageously, automatic power control is thereby achieved by utilizing the secondary light output from the lower surface of the SEL. Issues associated with using the primary light output for automatic power control are thereby avoided by utilizing an assembly in accordance with aspects of the invention.

These and other features and advantages of the present invention will become apparent from the following detailed description which is to be read in conjunction with the accompanying figures.

DETAILED DESCRIPTION OF THE INVENTION

This invention will be illustrated herein in conjunction with exemplary laser assemblies for applications comprising SELs. It should be understood, however, that the invention is not limited to the particular arrangements, materials, film layers and processing steps shown and described herein. Modifications to the illustrative embodiments will become apparent to those skilled in the art.

It should also be understood that the various features shown in the accompanying figures are not drawn to scale. Moreover, for economy of description, the figures are restricted to only those elements that are required to show aspects of the invention. In actual application, an assembly in accordance with aspects of the invention will likely contain more elements than those illustrated herein. Nevertheless, these more extensive assemblies will still come within the scope of the invention.

The term "standoff" as used herein is intended to encompass any physical structure suitable for separating two physical elements from one another.

Figure 1A:
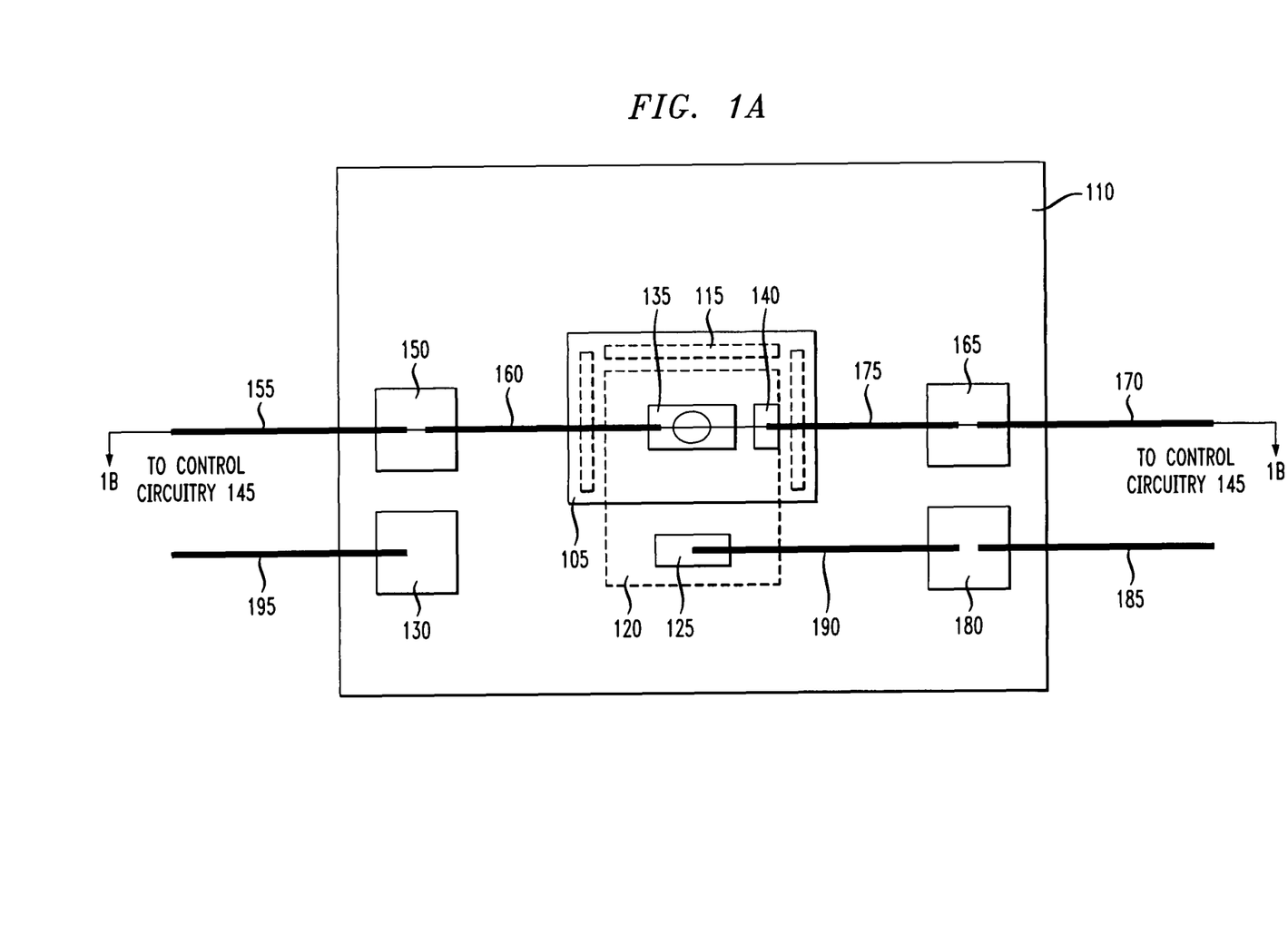
FIG. 1A shows a plan view of a portion of a laser assembly in accordance with an illustrative embodiment of the invention.
Figure 1B:
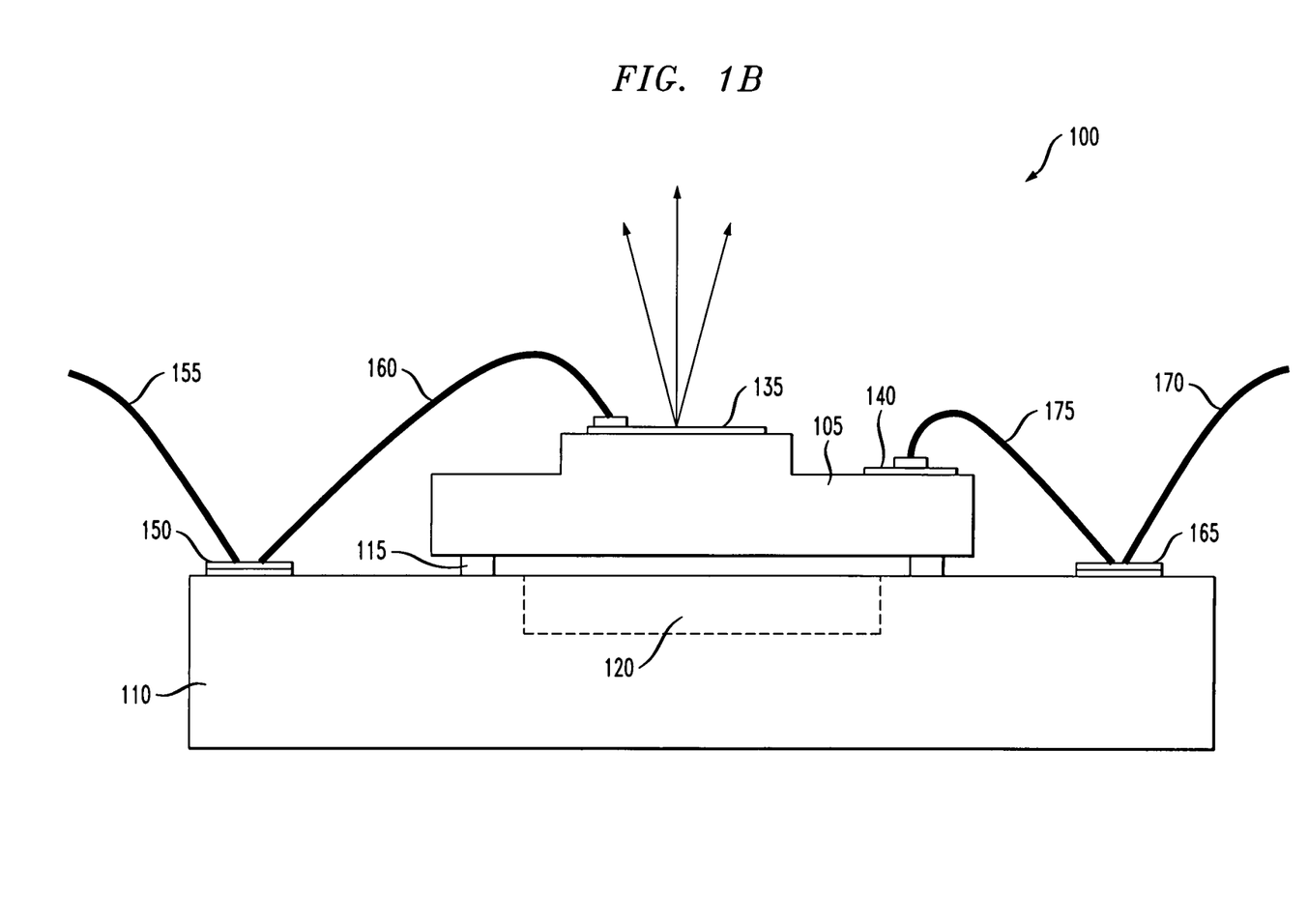
FIG. 1B shows a sectional view of the FIG. 1A assembly.

FIG. 1A shows a plan view of an assembly 100 in accordance with an illustrative embodiment of the invention. FIG. 1B shows a sectional view of the FIG. 1A assembly cut in a plane indicated in FIG. 1A.

The assembly 100 comprises a SEL 105 and a substrate 110. The SEL is attached to the substrate by three standoffs, represented by standoff 115. Built into the substrate is a diffusion region 120. Diffusion contact 125 is attached to this diffusion region. A substrate contact 130 is attached to the substrate outside the diffusion region. First and second SEL contacts, 135 and 140, respectively, are attached to the SEL. The first SEL contact defines a window that allows light to be emitted from the upper surface of the SEL.

Elements within the assembly 100 are electrically connected to control circuitry 145 that is external to the assembly. These electrical connections are achieved by utilizing various bond pads and wires designed for this purpose. Electrical connections between the control circuitry and the first SEL contact 135 is achieved by electrically connecting the control circuitry to first SEL bond pad 150 using first external SEL wire 155. The first SEL bond pad is, in turn, electrically connected to the first SEL contact via first internal SEL wire 160. In a similar way, the control circuitry is connected to the second SEL contact 140 via second SEL bond pad 165, second external SEL wire 170 and second internal SEL wire 175. Moreover, the control circuitry is attached to the diffusion contact 125 via diffusion bond pad 180, external diffusion wire 185 and internal diffusion wire 190. The substrate contact 130 is accessed by the control circuitry via substrate wire 195.

The substrate 110 in the assembly 100 preferably comprises n-type silicon. The bond pads, contacts and wires preferably comprise a conductive metal such as, but not limited to, aluminum, copper or silver. The first SEL bond pad 150, second SEL bond pad 165 and diffusion bond pad 180 each overlie a layer of dielectric material. In this way, these bond pads do not make electrical contact with the substrate.

Advantageously, the diffusion region 120 can be formed in the substrate 110 using conventional semiconductor processing techniques. Forming the diffusion region may comprise, for example, ion implanting impurities into the substrate and then annealing the substrate. The annealing step causes the impurities to migrate into the substrate and to become electrically active. Both processing steps will be familiar to one skilled in the art and are described in detail in a number of references, including, for example, S. Wolf et al., *Silicon Processing for the VLSI Era, Volume 1-Process Technology*, Lattice Press, 1986, which is incorporated herein by reference.

Figure 1C:
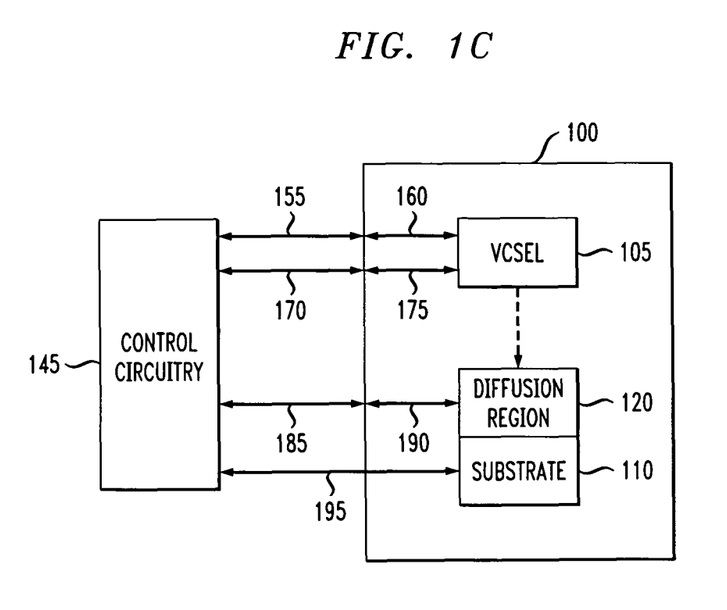
FIG. 1C shows a block diagram of the FIG. 1A assembly and its control circuitry.

A block diagram of the electrical connections between elements of the assembly 100 and the control circuitry 145 is shown in FIG. 1C. For ease of understanding, the signal pathways in the block diagram are labeled with reference numerals that correspond to their physical implementation (i.e., physical wiring) in FIGS. 1A and 1B.

Operation of the assembly 100 to achieve automatic power control can now be described.

The design, operating characteristics and formation of a SEL will be familiar to one skilled in the art. Moreover, SELs are described in detail in a number of readily available references including, for example, C. W. Wilmsen et al., *Vertical-Cavity Surface Emitting Lasers: Design, Fabrication, Characterization, and Applications*, Cambridge University Press, 1999, which is incorporated herein by reference.

As is typical, the SEL 105 comprises an active region sandwiched between upper and lower DBR mirrors. The SEL is powered by applying an electrical voltage across the active region, which, in turn, causes current to flow therein. Electrons in the active region attain high energy states as result of this applied voltage. When the electrons spontaneously drop in energy state, photons are produced. Some of these photons travel in a direction perpendicular to the reflective planes of the DBR mirrors. As a result of the ensuing reflections, these photons travel back and forth through the active region several times. When the photons interact with other high energy state electrons, stimulated emission occurs so that additional photons with similar characteristics are produced.

The output power of the SEL 105 may, therefore, be modified by changing the voltage across the active region of the SEL. The greater the amount of voltage applied to the active region, the greater the amount of stimulated emission that occurs in this active region and the greater the amount of light output. In the assembly 100, the control circuitry 145 applies this voltage to the SEL through the first and second SEL contacts 135, 140.

In a typical SEL, the upper and lower DBR mirrors are formed with slightly different reflectivities. In the particular SEL 105 in the assembly 100, the upper DBR mirror has a lower reflectivity than the lower DBR mirror. The primary light output of the SEL is, therefore, from the upper surface of the SEL (i.e., that surface farthest away from the substrate 110). Nevertheless, a smaller amount of secondary light is also emitted from the lower surface of the SEL (i.e., that surface nearest the substrate). The fraction of light emitted from the lower surface of the SEL is proportional to the light emitted from the upper surface. As a result, the output power of the light emitted from the lower surface of the SEL becomes an ideal source of feedback for controlling the primary output power of the SEL.

In accordance with an aspect of the invention, the secondary light emitted from the lower surface of the SEL 105 directly impinges on the diffusion region 120. When the diffusion region is doped such that it has a different conductivity type than the surrounding substrate, a pn junction is formed. When configured properly, this pn junction will act as a photodiode capable of converting the impinging light into a current signal, the magnitude of which is a function of the intensity of the impinging light. The design and operating characteristics of photodiodes formed with pn junctions are widely understood and will be familiar to one skilled in the art. Moreover, such devices are described in a number of references, including C. Davis, *Lasers and Electro-Optics: Fundamentals and Engineering*, Cambridge University Press, 1996, which is incorporated herein by reference.

In the particular assembly 100, the diffusion region 120 is doped so that it is p-type while the remainder of the substrate 110 is n-type. The light emitted from the lower surface of the SEL 105 impinges on the diffusion region and produces a current in the photodiode as a result of the photovoltaic effect. This current, in turn, is transmitted to the control circuitry 145 through the electrical connections shown on FIGS. 1A-1C.

Silicon-based photodiode arrangements like that in the assembly 100 are typically capable of measuring light intensity for laser light with a wavelength between about 100 and about 1,100 nanometers. Optionally, the control circuitry 145 can act to apply a voltage difference between the diffusion region 120 and the substrate 110, allowing the pn junction to be reverse biased. Reverse biasing the pn junction can make the photodiode more sensitive to light. A reverse biased pn junction also tends to respond more linearly to changes in light intensity.

Automatic power control of the SEL 105 in the assembly 100 is established by forming an electronic feedback loop between the SEL, the photodiode comprising the diffusion region 120 and the substrate 110, and the control circuitry 145. As just described, the photodiode transmits current, the magnitude of which is a function of the present light output power of the SEL, to the control circuitry. This current is then compared to a predetermined set-point operating current that would be produced by the photodiode if the SEL were producing a target output power. The comparison produces an error signal proportional to the difference in the actual SEL output power and the target output power. The control circuitry then modifies the applied voltage on the SEL in proportion to this error signal. If the SEL is operating at an output power higher than the target output power, the control circuitry decreases the applied voltage on the active region of the SEL so that stimulated emission within the active region is reduced. If, on the other hand, the SEL is operating at a lower output power than the target output power, the control circuitry increases the voltage acting on the active region and stimulated emission is increased. In this way, the control circuitry maintains the SEL at the target output power.

Advantageously, automatic power control is thereby achieved by utilizing the secondary light output from the lower surface of the SEL 105. Issues associated with using the primary light output for automatic power control are thereby avoided by utilizing an assembly in accordance with aspects of the invention.

It will be noted that the SEL 10S is attached to the upper surface of the substrate 110 with standoffs 115. The standoffs are operative to physically attach the SEL to the substrate. Moreover, the standoffs may serve to transfer heat generated by the SEL to the substrate as a means of dissipating heat from the SEL.

In the particular embodiment shown in FIGS. 1A and 1B, three rectangular standoffs 115 are utilized to attach the SEL 105 to the upper surface of the substrate 110. Nevertheless, this standoff design is entirely illustrative and other arrangements may be utilized and still come within the scope of the invention. For example, in another embodiment, it may be advantageous to use a single standoff to attach the SEL to the substrate. This single standoff could, for example, have a u-shaped cross-section in the plane parallel to the upper surface of the substrate. In still another configuration, however, four standoffs with circular cross-sections in the plane parallel to the upper surface of the substrate may be utilized. These circular standoffs may, for example, be placed proximate to the four corners of the SEL.

The standoffs 115 will preferably comprise one or more metallic materials, although suitable non-metallic materials may also be utilized. Metallic materials have the advantages of providing good thermal conduction between the SEL 105 and the substrate 110, while also being easily fabricated on the substrate and easily bonded to the SEL. The standoffs may be formed, for example, by depositing blanket layers of titanium, gold, platinum and gold-tin on the substrate. These layers are then patterned by photolithography and reactive ion etching (RIE) steps to form the three standoffs shown in FIG. 1B. Such lithography and RIE steps are conventionally used in semiconductor processing to pattern metallic features and will be familiar to one skilled in the art. They are also described in readily available references, such as the reference by S. Wolf et al. mentioned above and incorporated herein by reference. The standoffs may also be formed by other metal deposition techniques, such as, but not limited to, e-beam evaporation.

To achieve good attachment between the SEL 105 and the standoffs 115, those regions of the lower surface of the SEL that will be bonded to the standoffs (i.e., the bonding regions) are also coated with a metallic material such as gold. The SEL may then be attached to the standoffs by pressing the SEL to the standoffs while heating the assembly. After achieving a sufficiently high temperature, the gold-tin layer in the standoffs will melt and form a metallic bond with the bonding regions of the SEL. When the temperature is subsequently reduced, this metallic bond will act to hold the SEL to the standoffs.

Figure 1D:
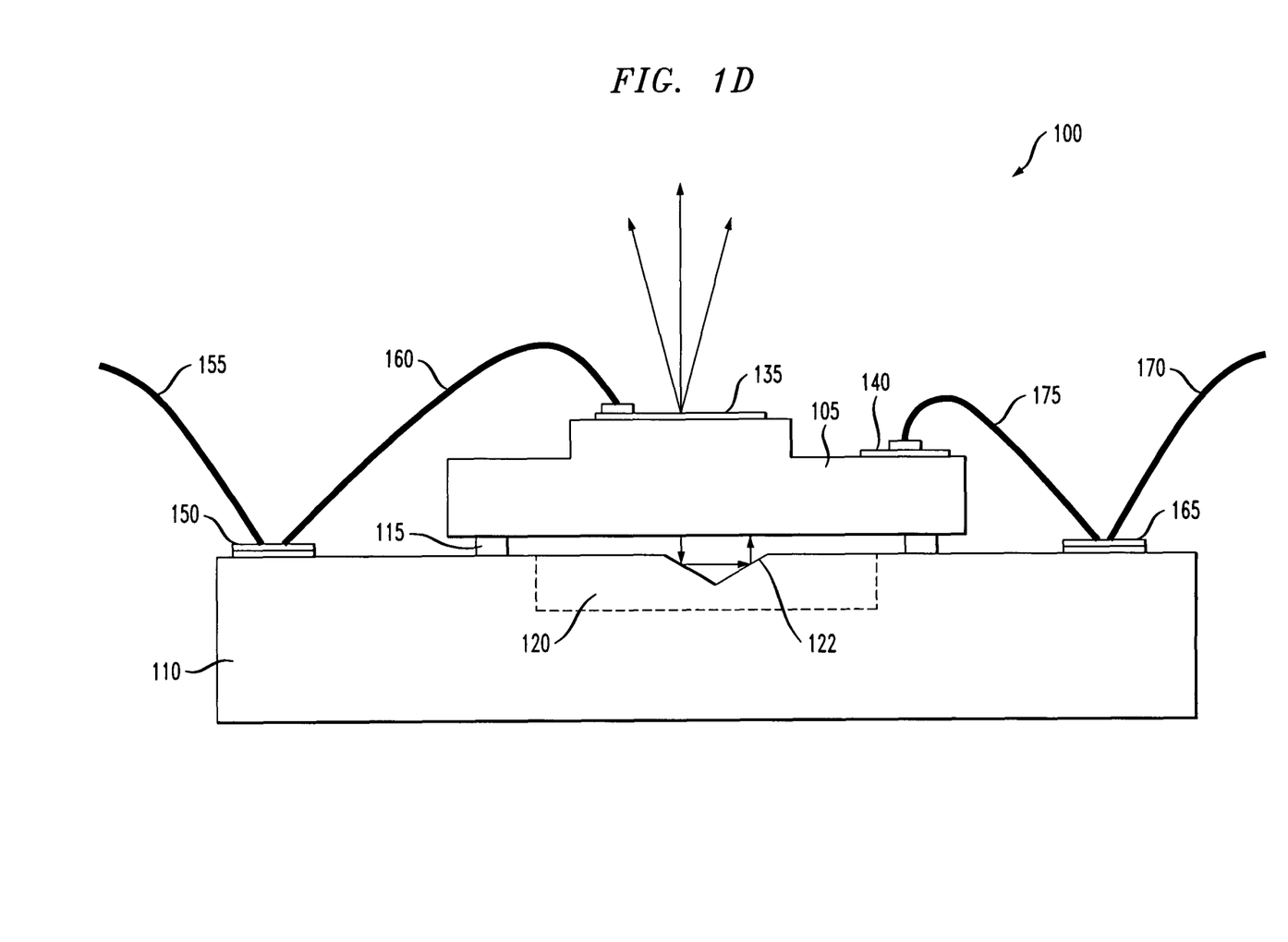
FIG. 1D shows a sectional view of the FIG. 1A assembly with a groove in the diffusion region.

Optionally and additionally, in accordance with another aspect of the invention, a groove may be formed in the diffusion region 120 to reduce the back-reflection of light into the SEL 105. FIG. 1D shows the assembly 100 with the addition of groove 122 to the diffusion region. The groove is preferably defined by four surfaces and has a wedge-shaped cross-section in the plane shown in the figure. The wedge-shaped groove is located such that the light emitted from the lower surface of the SEL falls on one of the angled surfaces of the groove. When the light strikes this angled surface, a portion of the light is reflected at an angle equal to the angle of incidence and, as a result, is steered away from the portion of the lower surface of the SEL where the light was emitted. Advantageously, this light does not reenter the SEL but is still measured by the photodiode.

Formation of the groove 122 in the diffusion region 120 can be performed before or after forming the diffusion region in the substrate 110. Formation of the groove is preferably accomplished by conventional photolithography and wet etching steps. To achieve the desired shape, the wet etch is configured such that the rate of chemical etching is highly sensitive to the crystal orientation of the substrate being etched (i.e., the wet etch is anisotropic). If the substrate is made of silicon, for example, such an anisotropic wet etch can be achieved by using a combination of potassium hydroxide, isopropyl alcohol and water.

Figure 2:
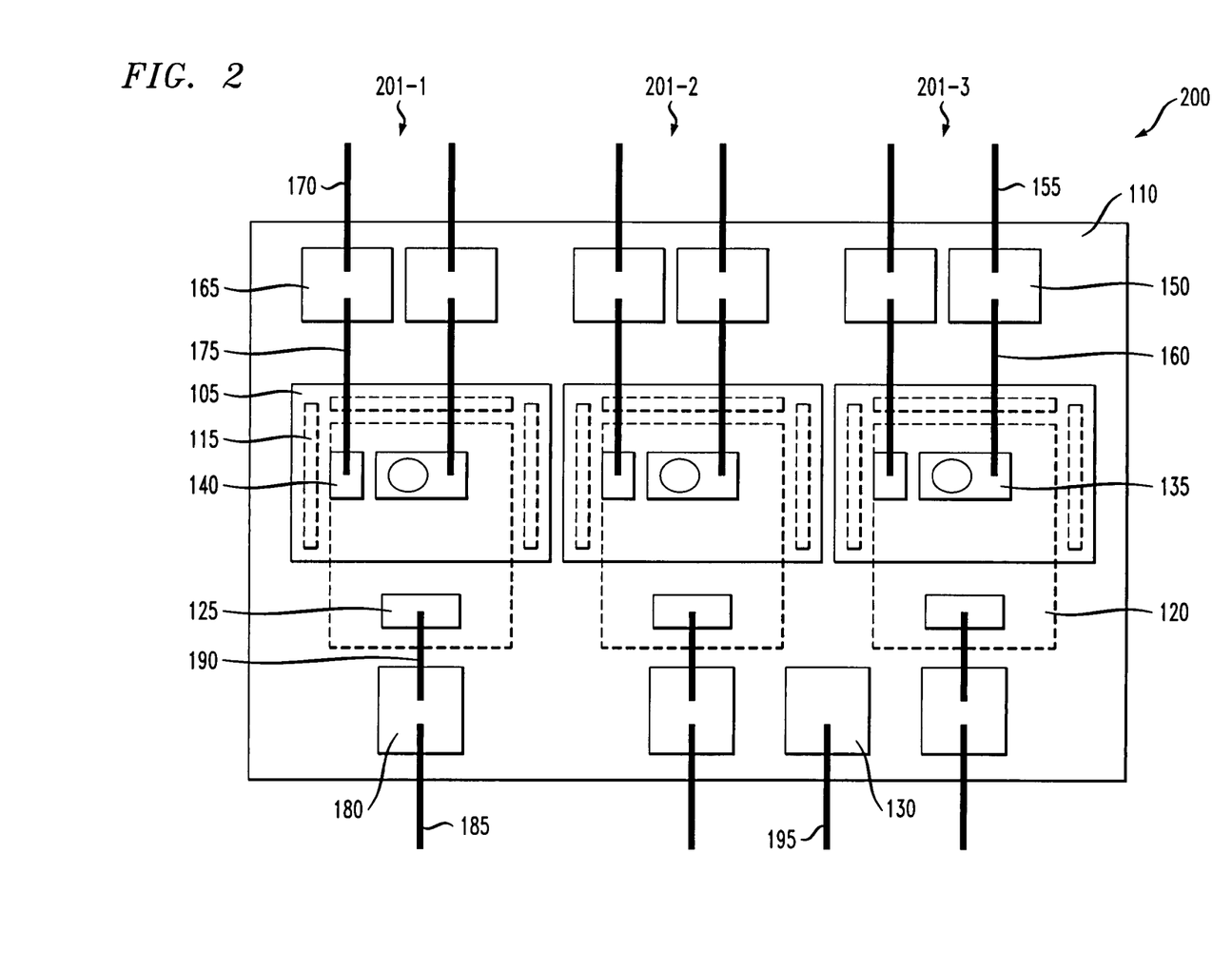
FIG. 2 shows a plan view of a portion of a multi-laser assembly in accordance with another illustrative embodiment of the invention.

FIG. 2 shows a plan view of a multi-laser assembly in accordance with another illustrative embodiment of the invention. The assembly 200 comprises three SEL modules 201-1, 201-2 and 201-3. Each SEL module contains substantially the same elements as the assembly 100 shown in FIGS. 1A and 1B, and these elements are therefore labeled with the same reference numerals. The separate wiring for each SEL module allows the control circuitry to provide independent automatic power control for each SEL in a way similar to that described above.

The SELs in a multi-laser assembly such as assembly 200 may emit light at the same wavelength or may emit light at different wavelengths, or a combination thereof. Where multiple SELs of the same wavelength are incorporated into a single assembly, simple arrangements of optics may be utilized to combine the primary outputs of the multiple SELs into a single laser beam. This single laser beam will have the combined power of the multiple SELs. A multi-laser assembly in accordance with aspects of the invention, therefore, is useful for creating laser beams with greater power than that which can be generated by any single SEL. Such a multi-laser assembly may be useful, for example, in a fiber optic communication system.

Figure 3:
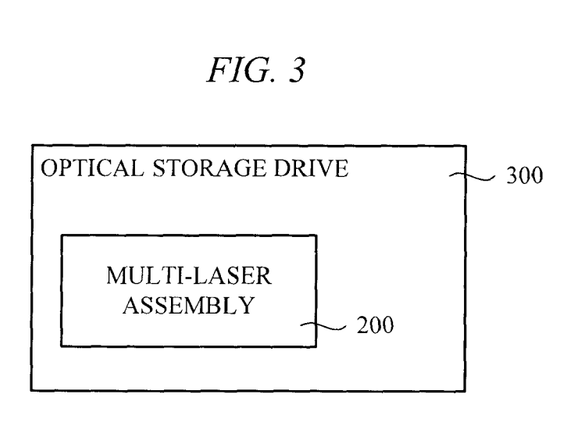
FIG. 3 shows a block diagram of an optical storage drive containing the FIG. 2 multi-laser assembly.

A multi-laser assembly like the assembly 200 may also be useful in an optical storage drive capable of recording and playing back data in accordance with several optical disc formats such as Blu-ray, DVD and CD. FIG. 3 shows such a multi-format optical storage drive 300 containing the multi-laser assembly 200. The multi-laser assembly utilizes SELs that emit light at different wavelengths from each other. Blu-ray is a relatively new optical disc format capable of recording and playing back high-definition content from, for instance, high definition broadcasting. Semiconductor lasers for Blu-ray application typically emit at a wavelength of 405 nanometers. Semiconductor lasers for DVD and CD applications typically emit at wavelengths of 660 and 785 nanometers, respectively.

Importantly, it is to be understood that, although illustrative embodiments of the present invention have been described herein with reference to the accompanying figures, the invention is not limited to those precise embodiments. For example, the particular lasers, mounting structures, circuitry and other characteristics described herein may be varied in other embodiments. One skilled in the art will recognize various other changes and modifications that may be made without departing from the scope of the appended claims.

What is claimed is:

1. A laser assembly comprising:
   a substrate, the substrate having a first doped region and a second doped region, the second doped region being proximate to an upper surface of the substrate and forming a pn junction with the first doped region;
   one or more standoffs; and
   a semiconductor laser, the semiconductor laser being operative to emit light from an upper surface and a lower surface and being attached to the upper surface of the substrate with the one or more standoffs such that the light emitted from the lower surface of the semiconductor laser impinges on the second doped region;
   wherein a groove is formed in the upper surface of the substrate entirely within the second doped region, the groove having at least first and second sloped surfaces;
   wherein the light emitted from the lower surface of the semiconductor laser and impinging on the second doped region impinges on one or more of the sloped surfaces of the groove;
   wherein the second doped region has a bottom surface substantially parallel to the upper surface of the substrate, the bottom surface being at a first depth from the upper surface of the substrate; and
   wherein the groove has a maximum depth from the upper surface of the substrate which is less than the first depth.

2. The laser assembly of claim 1, wherein the semiconductor laser comprises a surface-emitting laser.

3. The laser assembly of claim 1, wherein the second doped region is p-type and the first doped region is n-type.

4. The laser assembly of claim 1, wherein the first doped region surrounds at least a portion of the second doped region.

5. The laser assembly of claim 1, wherein the pn junction is reverse biased when the semiconductor laser is emitting light.

6. The laser assembly Of claim 1, wherein the pn junction generates current, the magnitude of which is a function of output power of the semiconductor laser.

7. The laser assembly of claim 1, wherein at least one of the one or more standoffs has a cross-section that is substantially circular or substantially rectangular in a plane parallel to the plane defined by the upper surface of the substrate.

8. The laser assembly of claim 1, wherein at least one of the one or more standoffs comprises a metallic material.

9. The laser assembly of claim 1, wherein the groove has a cross-section that is substantially wedge-shaped in a plane perpendicular to the plane defined by the upper surface of the substrate.

10. The laser assembly of claim 1, further comprising:
    a third doped region in the substrate, the third doped region being proximate to the upper surface of the substrate and forming a pn junction with the first doped region; and
    a second semiconductor laser, the second semiconductor laser being operative to emit light from an upper surface and a lower surface and being attached to the upper surface of the substrate with one or more standoffs such that the light emitted from the lower surface of the semiconductor laser impinges on the third doped region.

11. The laser assembly of claim 10 wherein the first and second semiconductor lasers emit light at different wavelengths from each other.

12. The laser assembly of claim 10, wherein the assembly comprises three or more semiconductor lasers.

13. An apparatus comprising:
    a laser assembly, the laser assembly comprising:
      a substrate, the substrate having a first doped region and a second doped region, the second doped region being proximate to an upper surface of the substrate and forming a pn junction with the first doped region;
      one or more standoffs; and
      a semiconductor laser, the semiconductor laser being operative to emit light from an upper surface and a lower surface and being attached to the upper surface of the substrate with the one or more standoffs such that the light emitted from the lower surface of the semiconductor laser impinges on the second doped region;
      wherein a groove is formed in the upper surface of the substrate entirely within the second doped region, the groove having at least first and second sloped surfaces;
      wherein the light emitted from the lower surface of the semiconductor laser and impinging on the second doped region impinges on one or more of the sloped surfaces of the groove;
      wherein the second doped region has a bottom surface substantially parallel to the upper surface of the substrate, the bottom surface being at a first depth from the upper surface of the substrate; and
      wherein the groove has a maximum depth from the upper surface of the substrate which is less than the first depth; and
    control circuitry, the control circuitry operative to control output power of the semiconductor laser in response to current generated by the pn junction.

14. The apparatus of claim 13, wherein the control circuitry is operative to maintain the output power of the semiconductor laser at a predetermined value.

15. The apparatus of claim 13, wherein the apparatus comprises an optical storage drive.

16. The apparatus of claim 15, wherein the optical storage drive is capable of recording data in accordance with at least two different optical disc formats.

17. The apparatus of claim 13, wherein the apparatus is a component in a fiber optic communication system.

18. A method of forming a laser assembly, the method comprising the steps of:
  forming a substrate, the substrate having a first doped region and a second doped region, the second doped region being proximate to an upper surface of the substrate and forming a pn junction with the first doped region; and
  attaching a semiconductor laser operative to emit light from an upper surface and a lower surface to the upper surface of the substrate with one or more standoffs such that the light emitted from the lower surface of the semiconductor laser impinges on the second doped region;
  wherein a groove is formed in the upper surface of the substrate entirely within the second doped region, the groove having at least first and second sloped surfaces;
  wherein the light emitted from the lower surface of the semiconductor laser and impinging on the second doped region impinges on one or more of the sloped surfaces of the groove;
  wherein the second doped region has a bottom surface substantially parallel to the upper surface of the substrate, the bottom surface being at a first depth from the upper surface of the substrate; and
  wherein the groove has a maximum depth from the upper surface of the substrate which is less than the first depth.

19. The laser assembly of claim 1, wherein the groove is shaped such that light emitted from a given portion of the lower surface of the semiconductor laser is steered away from the lower surface of the semiconductor laser.

20. The laser assembly of claim 1, wherein the groove is shaped such that light emitted from a given portion of the lower surface of the semiconductor laser is prevented from reentering the lower surface of the semiconductor laser.

* * * * *